United States Patent
Chen et al.

(10) Patent No.: US 8,716,131 B2
(45) Date of Patent: May 6, 2014

(54) THROUGH SILICON VIA LAYOUT

(71) Applicant: Taiwan Semiconductor Manufacturing Company, Ltd., Hsin-Chu (TW)

(72) Inventors: Ming-Fa Chen, Taichung (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 13/653,176

(22) Filed: Oct. 16, 2012

(65) Prior Publication Data

US 2013/0040453 A1 Feb. 14, 2013

Related U.S. Application Data

(63) Continuation of application No. 12/186,105, filed on Aug. 5, 2008, now Pat. No. 8,288,872.

(51) Int. Cl.
*H01L 21/44* (2006.01)

(52) U.S. Cl.
USPC ........................................................ 438/667

(58) Field of Classification Search
USPC ................... 438/667, 613, 637; 257/737, 734
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,118,180 A | 9/2000 | Loo et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,521,530 B2 * | 2/2003 | Peters et al. .................. 438/667 |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,022,609 B2 * | 4/2006 | Yamamoto et al. ........... 438/694 |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |

(Continued)

*Primary Examiner* — Thao P. Le
(74) *Attorney, Agent, or Firm* — Slater & Matsil, L.L.P.

(57) ABSTRACT

A system and method for forming under bump metallization layers that reduces the overall footprint of UBMs, through silicon vias, and trace lines is disclosed. A preferred embodiment comprises forming an under bump metallization layer over a plurality of through silicon vias, whereas the UBM is connected to only a portion of the total number of through silicon vias over which it is located. The trace lines connected to the through silicon vias may additionally be formed beneath the UBM to save even more space on the surface of the die.

20 Claims, 6 Drawing Sheets

(56) References Cited

U.S. PATENT DOCUMENTS

| | | | |
|---|---|---|---|
| 7,111,149 B2 | 9/2006 | Eilert | |
| 7,122,912 B2* | 10/2006 | Matsui | 257/797 |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,517,797 B2* | 4/2009 | Akram | 438/667 |
| 7,550,376 B2 | 6/2009 | Watanabe | |
| 8,349,733 B2* | 1/2013 | Yamano | 438/667 |
| 2005/0136635 A1 | 6/2005 | Savastiouk et al. | |
| 2007/0063352 A1 | 3/2007 | Archer, III et al. | |
| 2013/0049193 A1* | 2/2013 | Sakuma | 257/737 |

* cited by examiner

THROUGH SILICON VIA LAYOUT

This application is a continuation of U.S. patent application Ser. No. 12/186,105, filed on Aug. 5, 2008, entitled "Through Silicon Via Layout," which application is hereby incorporated herein by reference in its entirety.

TECHNICAL FIELD

The present invention relates generally to a system and method of manufacturing semiconductor devices, and more particularly to a system and method for manufacturing through silicon vias.

BACKGROUND

Generally, as illustrated in FIG. 1, a semiconductor die 100 can be connected to other dies or devices through bumps 101. These bumps 101 are normally connected to the semiconductor die 100 by layers of conductive material collectively known as under bump metallization (UBM) 103 that extend through a dielectric layer 111. The UBM 103 provides for a connection between the bump 101 and a contact pad 105 in order to electrically connect the bump 101 to the metal layers 107 and interconnects 109 formed within the semiconductor die 100.

However, while the contact pad 105, metal layers 107 and interconnects 109 are relatively small in size, the bump 101 and its corresponding UBM 103 are much, much larger. Accordingly, the UBM 103 has a much larger footprint on the surface of the die 100 than is required by the connection to the underlying metal layers 107 and interconnects 109. As devices are further scaled down, this large footprint on the surface of the semiconductor die 100 becomes even more of a liability, as multiple UMBs 103 compete for valuable real estate with other features such as trace lines on the surface of the die 100.

Accordingly, what is needed is a UMB and TSV combination that takes up less real estate on the surface of a semiconductor die, and also reduces or eliminates the competition between the UMBs and trace lines on the surface of a semiconductor die.

SUMMARY OF THE INVENTION

These and other problems are generally solved or circumvented, and technical advantages are generally achieved, by preferred embodiments of the present invention that provide a structure and method for forming through silicon vias beneath an under bump metallization layer.

In accordance with a preferred embodiment of the present invention, a semiconductor device comprises a substrate with a plurality of through silicon vias formed through the substrate. An under bump metallization layer is formed over the plurality of through silicon vias and is in electrical contact with at least one of the plurality of through silicon vias. Additionally, at least one of the plurality of through silicon vias is electrically separated from the under bump metallization layer.

In accordance with another preferred embodiment of the present invention, a semiconductor device comprises a substrate with one or more port through silicon vias and one or more connection through silicon vias, each of which has a contact pad. Additionally, there are one or more trace lines located within the substrate and connected to at least one of the contact pads connected to one of the connection through silicon vias. An under bump metallization is located over at least one of the connection through silicon vias and is in electrical connection with at least one of the port through silicon vias while being electrically isolated from at least one connection through silicon vias.

In accordance with yet another preferred embodiment of the present invention, a semiconductor device comprises a substrate with a plurality of through silicon vias extending through the substrate. An under bump metallization layer is located over the plurality of through silicon vias, and is electrically connected to at least one of the plurality of through silicon vias while being electrically isolated from at least one of the plurality of through silicon vias. A solder bump is located over the under bump metallization.

In accordance with yet another embodiment, a method of manufacturing a semiconductor device comprising providing a substrate with a first side and a second side and forming a plurality of openings in the substrate on the first side is provided. The plurality of openings are filled with a conductive material and a portion of the substrate on the second side is removed to expose the conductive material. An under bump metallization is formed over the plurality of openings, the under bump metallization in electrical contact with the conductive material in at least one of the plurality of openings and electrically isolated from the conductive material in another of the plurality of openings.

In accordance with yet another embodiment, a method of manufacturing a semiconductor device comprising providing a substrate and forming two or more through substrate vias through the substrate is provided. An under bump metallization layer is formed over the two or more through substrate vias and one or more of the through substrate vias is isolated from the under bump metallization with an isolation layer. One or more of the through substrate vias is connected to the under bump metallization through the isolation layer.

In accordance with yet another embodiment, a method of manufacturing a semiconductor device comprising providing a substrate and forming a port through substrate via through the substrate is provided. A connection is formed through substrate via through the substrate and a first contact pad is formed over the port through substrate via and a second contact pad over the connection through substrate via. A dielectric layer is formed over the first contact pad and the second contact pad and an opening is formed through the dielectric layer to substantially expose the first contact pad without substantially exposing the second contact pad. An under bump metallization is formed in the opening and over the connection through substrate via.

An advantage of a preferred embodiment of the present invention is that the area under the under bump metallization is utilized, thereby freeing valuable space on the surface of the device.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an under bump metallization with associated through silicon vias. The invention may also be applied, however, to other types of electrical connections.

Figure 1:
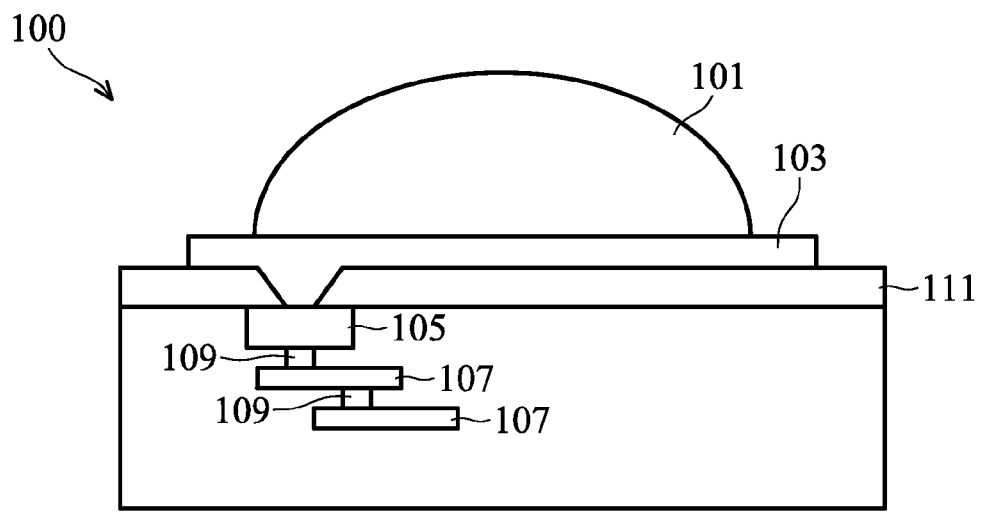
FIG. 1 illustrates a prior art device with a single port connected to an under bump metallization layer.
Figure 2:
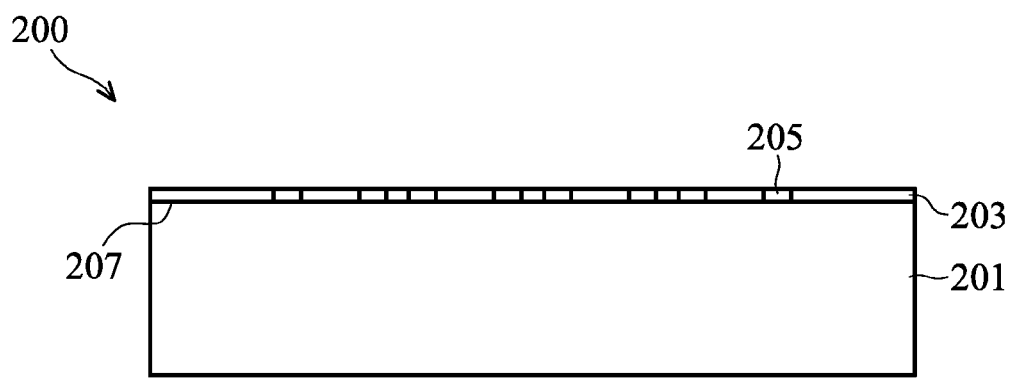
FIGS. 2 through 6 illustrate the formation of an under bump metallization layer that covers multiple through silicon vias in accordance with an embodiment of the present invention.

With reference now to FIG. 2, there is shown a portion of a die 200 including a substrate 201 with a first dielectric layer 203 over the substrate 201 and trace lines collectively referred to as 205 formed therein. The substrate 201 preferably comprises a semiconductor base material upon which are formed active devices (not shown) along with a series of alternating metal and dielectric layers meant to interconnect and route circuitry from the active devices.

The first dielectric layer 203 is preferably formed on the substrate 201 along a first side 207 of the substrate 201 over the active devices. The first dielectric layer 203 is preferably made of one or more suitable dielectric materials such as silicon oxide, silicon nitride, low-k dielectric such as carbon doped oxides, combinations of these, or the like. The first dielectric layer 203 is preferably formed through a process such as chemical vapor deposition (CVD), although any suitable process may be utilized.

Trace lines 205 are preferably formed within the dielectric layer 203. The trace lines 205 are preferably used to route electrical connections such as input/output signals or power signals between active devices or even between different dies. The design and layout of the trace lines 205 are, of course, dependent upon the requirements of the die 200, and all such layouts are fully intended to be included within the scope of this embodiment.

The trace lines 205 are preferably made of aluminum although any suitable conductive material, such as aluminum alloy, aluminum copper, copper, combinations of these, and the like, may alternatively be used. The trace lines 205 are preferably formed using through a chemical vapor deposition (CVD) process along with an etch to pattern the trace lines. However, other methods suitable to the specific material used (such as a damascene process for copper) may alternatively be used as well.

Figure 3:
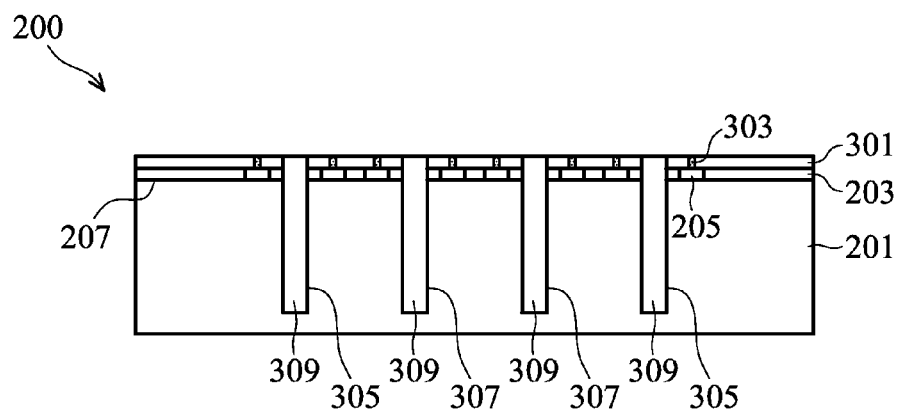

FIG. 3 illustrates the formation of a second dielectric layer 301 over the trace lines 205 and interconnections 303 to the trace lines 205. The second dielectric layer 301 may be made of a similar material and by a similar method as the first dielectric layer 203 discussed above with respect to FIG. 2. The interconnections 303 are preferably copper and are preferably formed through a damascene process, although any suitable material and method may be used to form the interconnections 303 to the trace lines.

FIG. 3 also illustrates the formation of one or more port TSV openings 305 along with connector TSV openings collectively referred to by number 307. The port TSV openings 305 and the connector TSV openings 307 are preferably made concurrently with each other, although they may alternatively be made through separate processes. The port TSV openings 305 and the connector TSV opening 307 are preferably formed by applying and developing a suitable photoresist (not shown), and then etching the second dielectric layer 301, the first dielectric layer 203, and a portion of the substrate 201. Alternatively, the port TSV openings 305 and the connector TSV openings 307 may be formed concurrently with the formation of the individual layers (e.g., dielectric and metal layers) as the die 200 is being built upwards from the substrate 201.

Preferably, the port TSV openings 305 and the connector TSV openings 307 are formed so as to extend into the substrate at least further than the electrical devices formed within and on the substrate 201, and preferably at least to a depth greater than the eventual desired height of the finished die 200. Accordingly, while the depth is dependent upon the overall design of the die 200, the depth is preferably between about 1 μm and about 700 μm below the active devices on the substrate 201, with a preferred depth of about 90 μm below the active devices on the substrate 201.

The port TSV openings 305 and the connector TSV openings 307 are preferably formed to have a diameter of between about 1 μm and about 100 μm, with a preferred diameter of about 6 μm. Additionally, while the pitch of the port TSV openings 305 and the connector TSV openings 307 in relation to each other are dependent upon the design of the die 200, the pitch is preferably either equal to or larger than about 60 μm.

Once the port TSV openings 305 and the connector TSV openings 307 have been formed, the port TSV openings 305 and the connector TSV openings 307 are preferably filled with a conductive material 309. The conductive material 309 preferably comprises a barrier layer (such as titanium nitride or tantalum nitride) and copper, although other suitable materials such as aluminum, alloys, doped polysilicon, combinations thereof, and the like, may alternatively be utilized. The conductive material 309 is preferably formed by depositing the barrier layer along with a seed layer and then electroplating copper onto the seed layer, filling and overfilling the port TSV openings 305 and the connector TSV openings 307. Once the port TSV openings 305 and the connector TSV openings 307 have been filled, excess conductive material 309 outside of the port TSV openings 305 and the connector TSV openings 307 is preferably removed through a grinding process such as chemical mechanical polishing (CMP), although any suitable removal process may be used.

Figure 4:
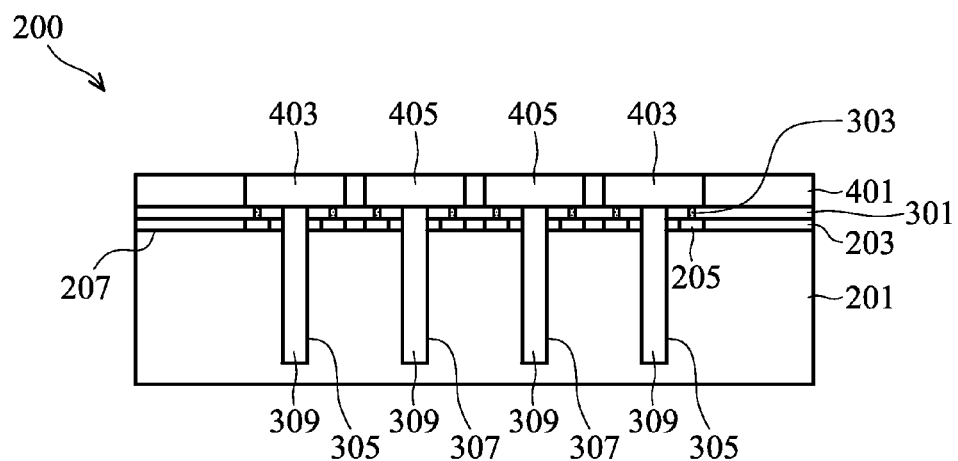

FIG. 4 illustrates the formation of one or more port TSV contact pads 403 and connector TSV contact pads collectively referred to as 405. The port TSV contact pads 403 are intended to connect port TSVs 603 (formed from the filled port TSV openings 305 as described below with respect to FIG. 6) to both the trace lines 205 and to the UBM to be formed (discussed below with respect to FIG. 5). The connector TSV contact pads 405 are intended to connect connector TSVs 605 (formed from the filled connector TSV openings 307 as described below with respect to FIG. 6) to their respective trace lines 205. The port TSV contact pads 403 and connector TSV contact pads 405 are preferably formed of the same material, aluminum, although they may be formed of different materials than each other, and other materials, such as aluminum alloy, aluminum copper, copper, combinations of these, and the like, may alternatively be used.

The port TSV contact pads 403 and connector TSV contact pads 405 may be formed in a variety of methods depending upon the material used. For example, if aluminum is used the port TSV contact pads 403 and connector TSV contact pads 405 are preferably formed by forming a layer of aluminum over the second dielectric layer 301, and then using a suitable technique such as photolithography and chemical etching to pattern the aluminum into the port TSV contact pads 403 and connector TSV contact pads 405. Alternatively, if copper is used the port TSV contact pads 403 and connector TSV contact pads 405 are preferably formed by initially forming a third dielectric layer 401, forming openings into the third dielectric layer 401, depositing a barrier layer and a seed layer (not shown), overfilling the openings with copper, and then using a grinding process such as CMP to remove excess copper outside of the openings to form the port TSV contact pads 403 and connector TSV contact pads 405. Any suitable process for forming the port TSV contact pads 403 and connector TSV contact pads 405 may be used and all of these processes are fully intended to be included within the scope of the present invention.

Figure 5:
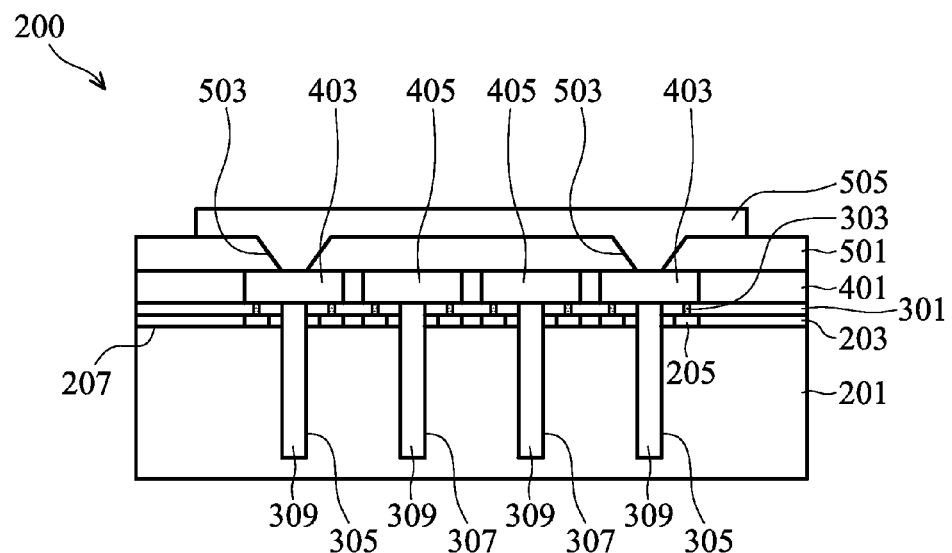

FIG. 5 illustrates the formation of a fourth dielectric layer 501 over the port TSV contact pads 403 and the connector TSV contact pads 405. The fourth dielectric layer 501 is preferably formed of a dielectric material similar to the first dielectric material 203 (described above with respect to FIG. 2) and is preferably formed through a similar process. Once the fourth dielectric 501 has been formed, one or more openings 503 are made through the fourth dielectric layer 501 so as to at least partially expose a portion of each of the port TSV contact pads 403. The openings 503 are preferably formed through a suitable photolithographic mask and etching process, although any suitable process to expose the port TSV contact pads 403 may be used.

FIG. 5 also illustrates the formation of a UBM 505 (also known as a UBM contact) that connects to the port TSV contact pads 403 through the fourth dielectric layer 501. Once the openings 503 have exposed the port TSV contact pads 403, the UBM 505 is preferably formed both over a portion of the fourth dielectric layer 501 and through the openings 503 so as to make physical and electrical contact with the port TSV contact pads 403. The UBM 505 is preferably made of at least three layers of conductive materials, such as a layer of chrome, a layer of a chrome-copper alloy, and a layer of copper, with an optional layer of gold over the top of the copper layer. However, one of skill in the art will recognize that there are many suitable arrangements of materials and layers, such as an arrangement of titanium/titanium tungsten/copper or an arrangement of copper/nickel/gold, that are suitable for the formation of the UBM 505. Any suitable materials or layers of material that may be used for the UBM 505 are fully intended to be included within the scope of the current application.

The UBM 505 is preferably created by forming each layer conformally over the fourth dielectric layer 501 and into the openings 503. The forming of each layer is preferably performed using a CVD process, such as PECVD, although other processes of formation, such as sputtering, evaporation, or plating process, may alternatively be used depending upon the desired materials. Each of the layers within the UBM 505 preferably has a thickness of between about 10 μm and about 100 μm, with a preferred thickness of about 45 μm. Once the desired layers have been formed, portions of the layers are then removed preferably through a suitable photolithographic masking and etching process to remove the undesired material and to leave a patterned UBM 505.

The UBM 505 is preferably formed such that it overlies not only the port openings 305, but also one or more of the connection openings 307. The UBM 505 is also preferably formed to overlie at least one of the trace lines 205. In this manner the UBM 505, the connection openings 307 (and later formed connections TSVs 605), and the trace lines 303 can be integrated in three dimensions instead of the usual two dimensions, thereby reducing the overall two dimensional footprint for all of these components on the surface of the die 200.

Figure 6:
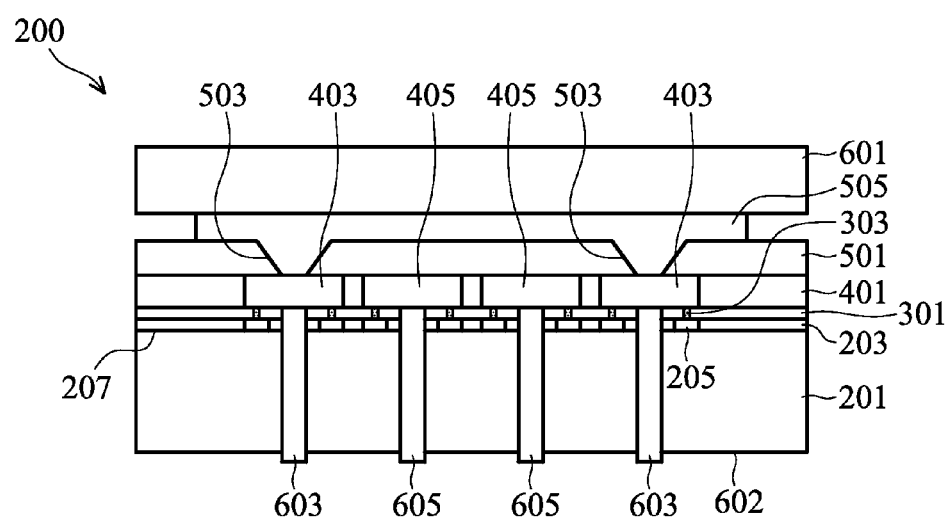

FIG. 6 illustrates the formation of port TSVs 603 from the port TSV openings 305 and the formation of connection TSVs 605 from the connection TSV openings 307. Preferably, a carrier 601 is attached to the die 200 over the UBM 505. The carrier 601 may comprise, for example, glass, silicon oxide, aluminum oxide, and the like. In an embodiment, a second adhesive (not shown) may be used to glue the carrier 601 to a top surface of the die 200. The second adhesive may be any suitable adhesive, such as an ultraviolet (UV) glue, which loses its adhesive property when exposed to UV lights. The preferred thickness of the carrier is preferably greater than about 12 mils.

Alternatively, the carrier 601 may preferably comprise a suitable carrier tape. If a carrier tape is utilized, the carrier tape is preferably the commonly known blue tape. The carrier tape is preferably attached to the die 200 using a second adhesive (not shown) located on the carrier tape.

Once attached to the carrier 601, portions of a second side 602 of the die 200 are then removed to expose the conductive material 309 located within the port TSV openings 305 to complete the port TSVs 603 and also to expose the conductive material 309 within the connection TSV openings 307 to complete the connection TSVs 605. The removal is preferably performed with a grinding process such as a CMP, although other suitable processes, such as etching, may alternatively be used. The removal process preferably removes between about 1 μm and about 50 μm, and more preferably removes about 20 μm of the second side of the die 200.

As one of skill in the art will recognize, the process presented above to form the port TSVs 603 and the connection TSVs 605, including the formation of the vias, deposition of a conductor 30, and subsequent thinning of the second side 602 of the substrate 201, is merely one method to form the TSVs. In another method, the port TSVs 603 and the connection TSVs 605 may be formed by etching vias partially through the substrate 201 and depositing a dielectric layer in the vias. In this embodiment, the dielectric layer within the vias is removed after the backside of the substrate 201 is thinned, and a conductive material is re-deposited within the via. This method, and any other suitable method for forming the port TSVs 603 and the connection TSVs 605, may alternatively be used and are fully intended to be included within the scope of the present invention. Furthermore, the port TSVs 603 and the connection TSVs 605 may have a liner preferably formed of a dielectric such as an oxide, nitride, or the like.

Figure 7A:
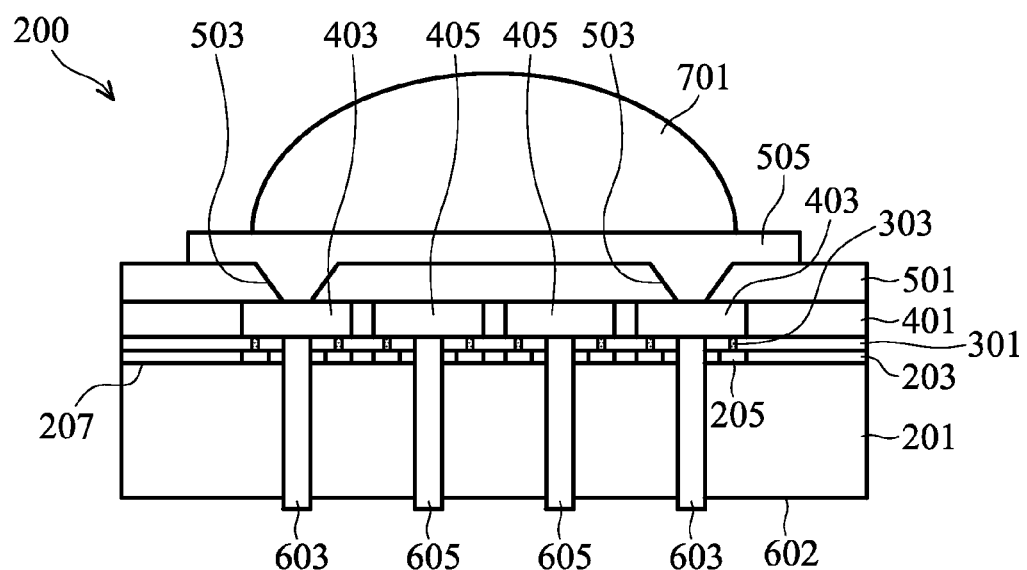
FIGS. 7A and 7B show the formation of a contact over the under bump metallization in accordance with an embodiment of the present invention.

FIG. 7A illustrates the formation of a contact bump 701 over the UBM 505. The contact bump 701 preferably comprises a material such as tin, or other suitable materials, such as silver or copper. In an embodiment in which the contact bump 701 is a tin solder bump, the contact bump 701 may be formed by initially forming a layer of tin through such commonly used methods such as evaporation, electroplating, printing, solder transfer, ball placement, etc, to a preferred thickness of about 100 μm. Once a layer of tin has been formed on the structure, a reflow is preferably performed in order to shape the material into the desired bump shape.

Figure 7B:
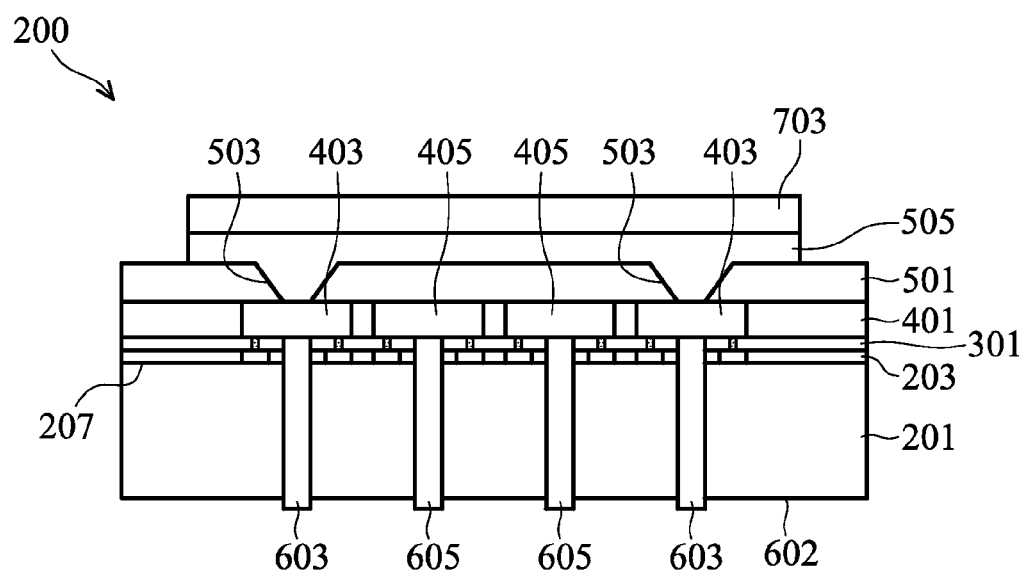

FIG. 7B illustrates an alternative embodiment wherein a contact pad 703, instead of a contact bump 701, is formed over the UBM 505. In this embodiment the contact pad 703 preferably comprises copper, although any suitable conductive material, such as aluminum or tungsten, may alternatively be used. In an embodiment in which the contact pad 703 is copper, the contact pad 703 is preferably formed through a suitable plating process, although other processes for other materials, such as CVD, may alternatively be used. The contact pad 703 is preferably formed in a rectangular shape, although any suitable shape, such as a square or octagonal shape, may be used as desired.

Figure 8A:
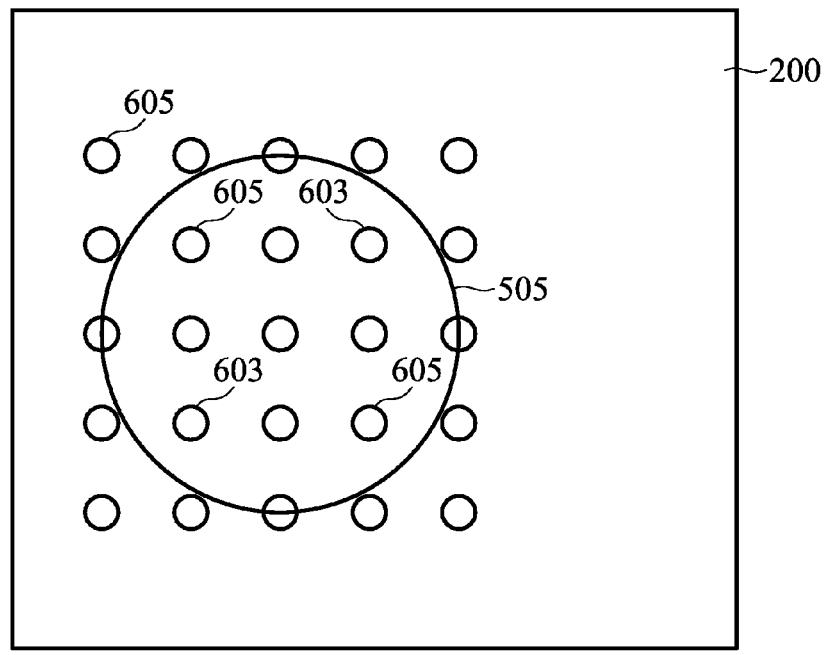
FIGS. 8A and 8B illustrate top down views of different through silicon via layouts in accordance with embodiments of the present invention.
Figure 8B:
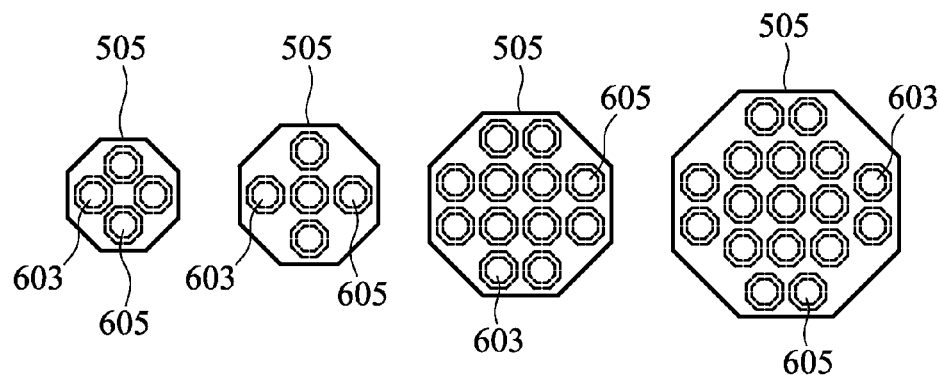

FIGS. 8A-8B illustrate potential overhead views of the UBM 505 and its underlying port TSVs 603 and connection TSVs 605. FIG. 8A illustrates a view where the UBM layer 505 is preferably patterned into a circular shape, although any suitable shape, such as hexagonal, octagonal, or square, that may be required by the overall design of the die 200 may alternatively be used. The UBM layer 505 preferably has a diameter of between about 30 μm and about 400 μm, with a preferred diameter of about 80 μm.

As illustrated, multiple port TSVs 603 and connection TSVs 605 are preferably located under the UBM 505, with the pattern of connection TSVs 605 also extending outward from underneath the UBM 505. Further, while two port TSVs 603 were illustrated in FIGS. 2-7B, any number of TSVs located under the UBM 505 may be connected to the UBM 505 as a port TSV 603. Any combination of port TSVs 603 and connection TSVs 605 may be used to connect the components of the die 200, and every combination is fully intended to be within the scope of the present application.

FIG. 8B illustrates a number of alternative embodiment in which the UBM 505 is formed in an octagonal shape with diameters ranging from 160 μm to 300 μm. As illustrated, depending upon the size of the UBM 505, different layouts of the port TSVs 603 and connection TSVs 605 under the UBM 505 are possible. For example, if the UBM 505 is about 160 μm in diameter, a substantially square layout of port TSVs 603 and connection TSVs 605 may be utilized, if the UBM 505 is about 180 μm in diameter, a cross pattern may be utilized, and, if the size of the UBM 505 allows, more complicated patterns utilizing more TSVs may alternatively be used. As before, any combination of port TSVs 603 and connection TSVs 605 may be used within the pattern.

Figure 9:
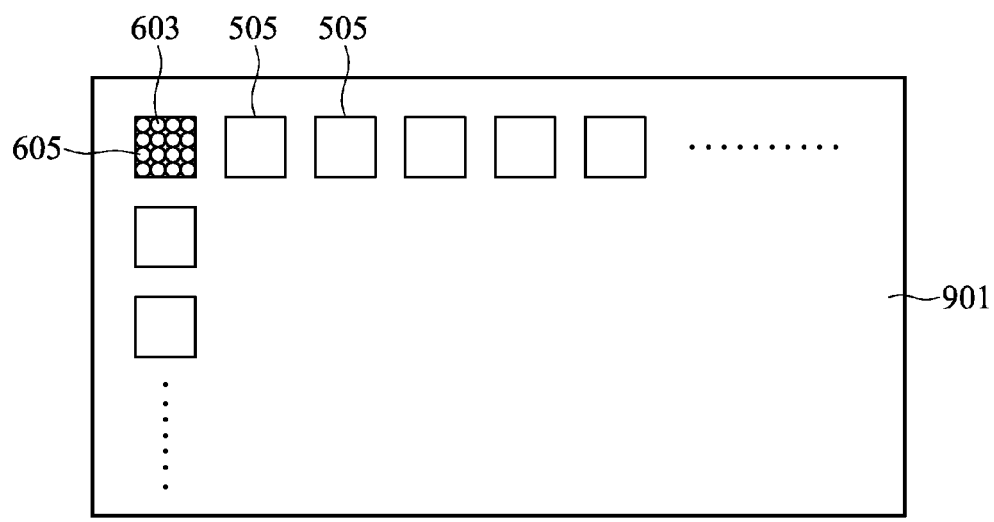
FIG. 9 illustrates a top down view of a layout of under bump metallizations on a semiconductor device in accordance with an embodiment of the present invention.

FIG. 9 illustrates a potential distribution of multiple UBMs 505 on a die 200, wherein one of the illustrated UBMs 505 illustrates the underlying port TSVs 603 and connection TSVs 605. This distribution of UBMs 505 preferably has a pitch of between about 60 μm and about 600 μm, with a preferred pitch of about 150 μm.

By placing the connection TSVs 605 under the UBM 505 along with the port TSVs 603, less space on the surface of the die 200 needs to be taken up by trace lines. As such, these die may be spaced closer together and have less of an overall footprint when connected. This helps to reduce the size of circuit components in general, leading to smaller devices overall.

Although the present invention and its advantages have been described in detail, it should be understood that various changes, substitutions and alterations can be made herein without departing from the spirit and scope of the invention as defined by the appended claims. For example, it will be readily understood by those skilled in the art that the method used to form the through silicon vias may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
providing a substrate with a first side and a second side;
forming a plurality of openings in the substrate on the first side;
filling the plurality of openings with a conductive material;
removing a portion of the substrate on the second side to expose the conductive material; and
forming an under bump metallization over the plurality of openings, the under bump metallization in electrical contact with the conductive material in at least one of the plurality of openings and electrically isolated from the conductive material in another of the plurality of openings.

2. The method of claim 1, further comprising forming contact pads over the first side and over respective ones of the filled plurality of openings.

3. The method of claim 1, further comprising:
forming at least one trace line within the substrate; and
connecting the conductive material in one of the plurality of openings to the at least one trace line.

4. The method of claim 1 wherein the plurality of openings have a pitch of about 60 μm.

5. The method of claim 1, further comprising forming a dielectric layer between the under bump metallization and the electrically isolated conductive material.

6. The method of claim 1, further comprising connecting the under bump metallization to the conductive material in more than one of the plurality of openings.

7. A method of manufacturing a semiconductor device, the method comprising:
providing a substrate;
forming two or more through substrate vias through the substrate;
forming an under bump metallization layer over the two or more through substrate vias;
isolating one or more of the through substrate vias from the under bump metallization with an isolation layer; and
connecting one or more of the through substrate vias to the under bump metallization through the isolation layer.

8. The method of claim 7, further comprising forming one or more trace lines within the substrate.

9. The method of claim 8, further comprising connecting at least one of the isolated through substrate vias to at least one of the one or more trace lines.

10. The method of claim 8, further comprising connecting at least one of the connected through substrate vias to at least one of the one or more trace lines.

11. The method of claim 7, further comprising forming a contact pad between the under bump metallization and at least one of the two or more through substrate vias.

12. The method of claim 7, further comprising forming a contact pad between the one or more of the through substrate vias connected to the under bump metallization and the under bump metallization.

13. A method of manufacturing a semiconductor device, the method comprising:
 providing a substrate;
 forming a port through substrate via through the substrate;
 forming a connection through substrate via through the substrate;
 forming a first contact pad over the port through substrate via and a second contact pad over the connection through substrate via;
 forming a dielectric layer over the first contact pad and the second contact pad;
 forming an opening through the dielectric layer to substantially expose the first contact pad without substantially exposing the second contact pad; and
 forming an under bump metallization in the opening and over the connection through substrate via.

14. The method of claim 13, further comprising forming a bump on the under bump metallization.

15. The method of claim 13, further comprising:
 forming a trace line in the substrate; and
 connecting the first contact pad to the trace line.

16. The method of claim 13, further comprising:
 forming a trace line in the substrate; and
 connecting the second contact pad to the trace line.

17. The method of claim 13, wherein forming the port through substrate via is performed at least in part through a chemical mechanical polish.

18. The method of claim 13, wherein the under bump metallization is formed in the shape of an octagon.

19. The method of claim 13, further comprising forming an uncovered through substrate via that remains uncovered by the under bump metallization.

20. The method of claim 13, wherein the port through substrate via and the connection through substrate via have a pitch of about 60 μm.

* * * * *